United States Patent [19]

Eggert et al.

[11] 3,997,819
[45] Dec. 14, 1976

[54] HOUSING FOR ELECTRICAL COMMUNICATIONS AND MEASURING DEVICES

[75] Inventors: Hans-Joachim Eggert, Karlsfed; Otto Oberberger, Gilching; Heinrich Zenkert, Munich, all of Germany

[73] Assignee: Siemens Aktiengesellschaft, Berlin & Munich, Germany

[22] Filed: Sept. 4, 1975

[21] Appl. No.: 610,299

[30] Foreign Application Priority Data

Sept. 9, 1974 Germany ............... 2443122

[52] U.S. Cl. .................. 317/100; 200/307; 317/120; 325/355; 317/101 CB
[51] Int. Cl.² ................... H05K 7/20
[58] Field of Search ........... 312/351; 317/100, 120, 317/101 CB, 101 PH, 101 R; 325/352, 353, 355, 356, 357; 174/52 R; 200/307

[56] References Cited
UNITED STATES PATENTS 2,788,470  4/1957  Giel ............... 317/101 CB
3,569,788  3/1971  Niblack ........... 317/101 R
3,808,504  4/1974  Rabic ............. 317/120
3,904,937  9/1975  Levin ............. 317/101 CB
3,925,710  12/1975 Ebert ............. 317/100

*Primary Examiner*—Gerald P. Tolin
*Attorney, Agent, or Firm*—Hill, Gross, Simpson, Van Santen, Steadman, Chiara & Simpson

[57] ABSTRACT

A housing for use in electrical, communications or measurement fields for containing components, including plug-in components comprising a six-sided housing with openable front and back covers sealably attachable to the main housing body, the housing body having component carriers positioned therein for receipt of components from either the front or rear, the covers having an interior configuration adapted to receive components and the housing being attached to a support frame through a vibration accommodating connection.

7 Claims, 17 Drawing Figures

HOUSING FOR ELECTRICAL COMMUNICATIONS AND MEASURING DEVICES

BACKGROUND OF THE INVENTION

1. Field of the Invention

This invention relates to housings for use in the electrical, communication and measuring fields wherein the housing is adapted to receive electrical components and protect them against shock.

2. Prior Art

In the electrical communications and measurement fields, housings are often provided which are designed to safeguard against shock. Such housing may be secured in a framework which surrounds the housing in a manner which allows for relative vibration between the framework and the housing. Such housings can be equipped with at least one support member interiorly thereof in which plug-in modules are located. Such support carriers are variably secured behind a detachable front cover of the housing and operating elements such as switches, dials, etc., can be mounted on the front cover and operatively connected to the components interior of the housing. Such shock absorbing housing mountings for use in the above fields are known and, for example, are illustrated in German Offenlegungsschrift No. 1,665,772. That reference shows one or more such housing devices secured through vibration dampening mountings in a support frame. The mounting is such that, due to the application of a type of diagonal spring suspension, the housings and their contents are secured against shock applied to the assembly in any direction. It is also known to construct such housings in a waterproof, pressurized assembly wherein the removable front cover is joined to the housing edge by a packing or seal. Any operating elements located on the front cover are likewise sealed against water, for example, by means of O ring seals.

In such prior art devices, a problem arises in providing unhindered access to the interior of the housing from other than the front cover. Such access is desirable, for example, for carrying out maintenance work or the making of internal adjustments in a simple manner without total disassembly and removal of the housing from the frame. Additionally, it would be desirable to improve the prior art by providing improved internal arrangements allowing arrangement of the housing carried components both in good spatial relationship as well as in a manner in which provides for improved cooling of those components which produce a large amount of heat.

SUMMARY OF THE INVENTION

Our invention is designed to overcome the disadvantages of the prior art and provide improvements in the above described areas.

Our invention provides a housing for devices used in the electrical, communications and measurement fields. The housing is secured in a frame in a manner allowing relative vibration between the housing and the frame for the purpose of safeguarding against shock. The housing contains at least one components carrier which is adapted to receive plug-in modules and which is variously secured behind a detachable front housing cover on which operating elements may be arranged and which is closable in tight sealing connection with the remaining of the housing. Particularly, the housing consists of a framelike case open at two opposed sides, preferably the front and back. The housing is sealed at the front as well as at the back by tightly closing covers, a moisture and electrically insulating seal being provided by packings interposed between the cover and housing frame. The packing is arranged on collar portions of the inside faces of the covers. The covers are tub-shaped or recessed from the peripheries and are equipped on their inner sides with those particularly high heat producing components which are to be received in the housing thereby providing good heat dissipation. Additionally, the front cover is equipped with operating elements and electrical connection contacts which are protected by an exterior protruding peripheral collar. Further, individual component carriers are contained in the interior of the housing in at least a portion of the space defined thereby. The component carriers receive plug-in modules that can be inserted from either the front or back side. The remaining space interior of the housing is used for connection of strong heat producing components directly to the housing in such a way as to provide for good heat conductivity.

Additionally, the housing can be improved from the prior art by constructing the housing main frame section either as a double profile consisting of metal sheets which are welded together or as a single cast metal member. The housing main frame section additionally has ribs and additionally guide rails on the external upper and lower surfaces, all of which are designed to provide both support and stacking possibilities for a plurality of housings of equal or varying yet proportional structural widths and heights.

Further, in our preferred embodiments, the front and rear covers are secured to the main housing frame by means of hinge and latch type supports. Preferably, the rear cover is secured directly to the main frame section of the housing by means of hinges whereas the front cover is secured by an extendable plate attached interiorly of the main frame. The hinges can be secured to the main frame either laterally or on the upper or bottom sides providing either horizontal or vertical opening of the covers.

Due to the inventive housing design, including the vibration accommodating attachment to the main supporting frame, a construction is achieved wherein the components in the housing are easily accessible from the front as well as from the rear side and where, moreover, the components arranged in the front and rear covers are also easily accessible. Stacking an assembly of such housings of various heights and widths can be simply achieved by means of projecting cams so that a larger grouping of individual housings can be accommodated in a single main support frame without disadvantageously affecting maintenance inasmuch as the individual components or devices can be examined through the detachable housing covers.

Other objects, features and advantages of the invention will be readily apparent from the following description of a preferred embodiment thereof, taken in conjunction with the accompanying drawings, although variations and modifications may be effected without departing from the spirit and scope of the novel concepts of the disclosure, and in which:

DESCRIPTION OF THE PREFERRED EMBODIMENTS

Figure 1:
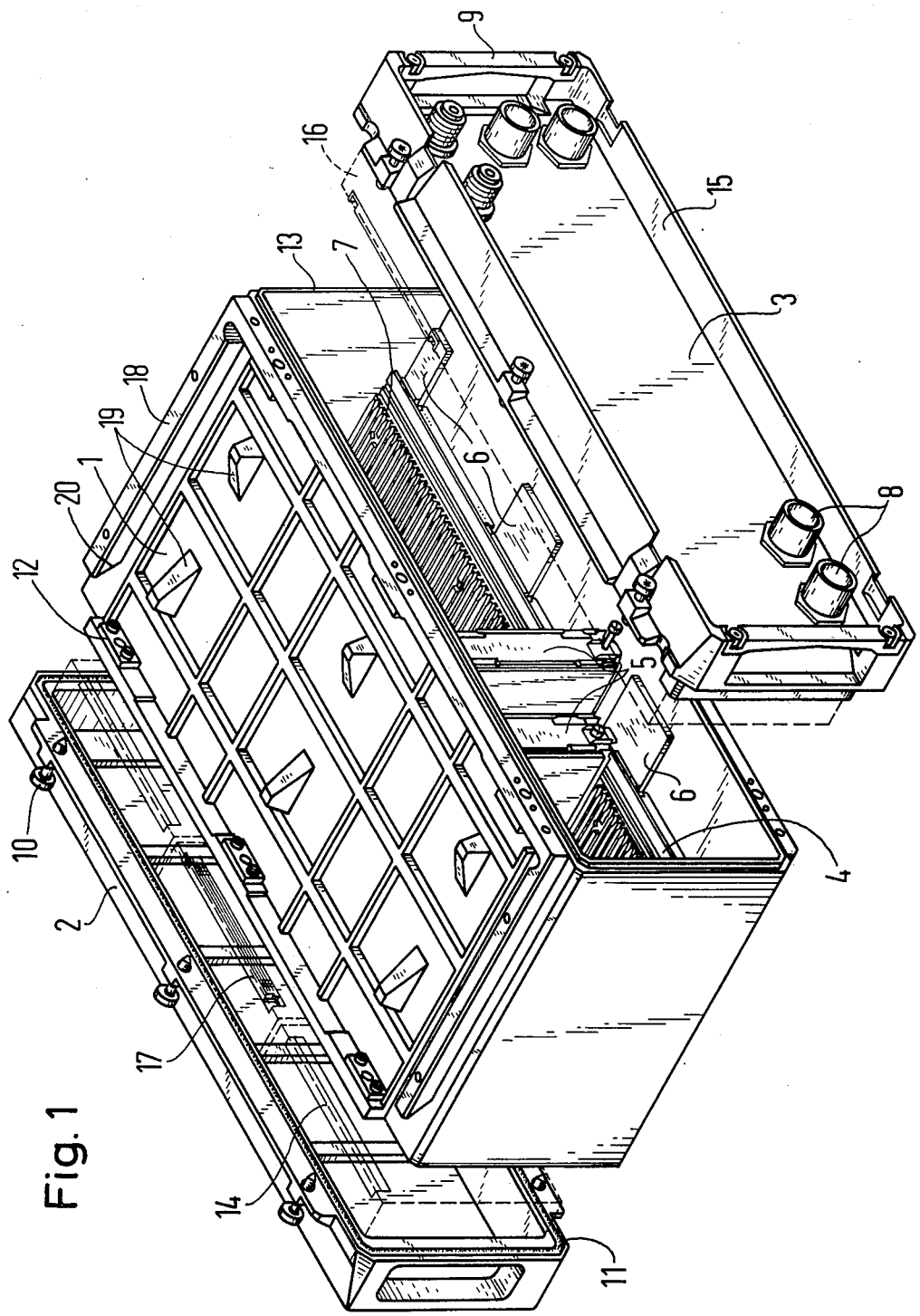
FIG. 1 is a perspective exploded view of a housing according to this invention.

FIG. 1 is an exploded view of a components housing according to the invention. The housing consists of a main housing frame 1 which is open at both the front and rear sides but which is equipped with covers for complete closure and sealing. The rear side is sealed by a cover 2 which has a recessed interior face forming a tub-like construction which is U-shaped in cross section. The cover has a groove running around the periphery thereof on the inside face in which a sealing cord or packing which is capable of sealing both electrically as well as against moisture. The seal 11 may be constructed of any of a variety of known elements, for example conductive rubber material. The cover 2 is secured to the main housing frame 1 by means such as screws 10 which are received in threaded sockets 12 of the main housing frame 1. To insure sealing, the main housing frame 1 has a rib 13 on both the front and rear sides which extends completely around the open ends and which extends outwardly and is pressed into the seal 11 upon closure of the covers. As indicated by the broken lines 14 on the interior side of the rear cover, additional components are located in the tub-like indentation or recess, the components projecting in the direction of the main housing frame 1. The components 14 are preferably those components which develop the greatest degree of heat in order that the heat produced by them can be discharged directly into the cover 2.

The front side of the main housing frame 1 is closed by cover 3 which is constructed similarly to the rear cover including the internal recess and seal receiving groove. The outer side of the front cover 3 has a collar 15 extending therearound projecting outwardly from a central face section. The collar 15 provides a perimeter protection for plugs 8 and various other operating components which can project through the cover. Additionally hand grips 9 are provided integrally with the cover as a portion of the collar 15 adjacent the sides of the cover. The cover 3 is again attached to the main housing frame 1 by means of screws received in threaded openings carried by the main housing frame. Broken lines 16 indicate components, preferably high heat producing components, stored in the recess in the front cover similarly to the components 14 illustrated in the rear cover with the components projecting somewhat into the interior of the main housing frame 1 when the cover is attached. As illustrated at 17 on the rear cover, components such as the components 14 and 16 can be in direct electrical contact with other components stored in the main housing frame 1 by means of devices such as multipoint connectors which are brought into contact within internal connector sections upon attachment of the covers. It is additionally possible, instead of such connectors 17 to provide flexible cable cords or the like according to known methods.

The actual main housing frame 1 contains primarily plug-in component modules such as those indicated at 5. For this purpose, the interior of the main housing frame is provided with one or more additional assembly carriers having channels 7 for receipt of the plug-in modules. The assembly carriers are preferably formed of ribbed aluminum plates in order to provide good heat transmission from the plug-in modules via the channels 7. The ribbed plates themselves are connected to the main housing frame 1 by way of additional plates 6 mounted on the inner sides of the housing and located both above and below the ribbed plates. The additional plates 6 again provide good heat transmission from the ribbed plates to the main housing frame.

Additionally, the covers 2 and 3 may preferably be fabricated from die cast aluminum in order to provide both good heat conductivity and desired rigidity.

Figure 2:
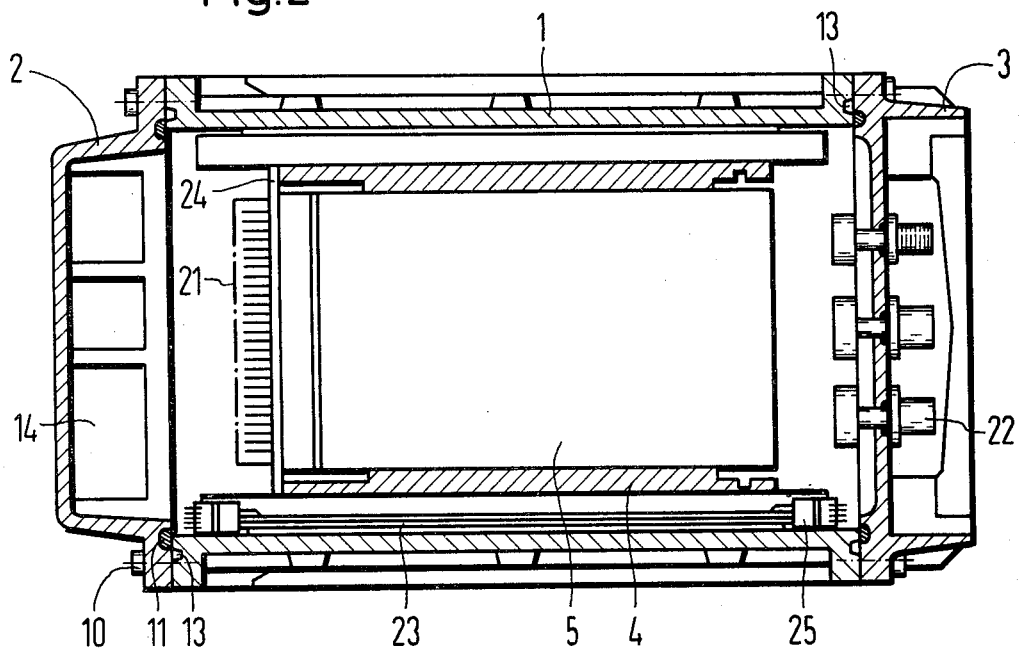
FIG. 2 is a cross sectional view of the housing of FIG. 1.

FIG. 2 illustrates the housing of FIG. 1 in cross section with the bottom ribbed plate being identified at 4. On the back side of the frame 4 multi-point connectors or plug boards 21 are secured on sheet metal holders 24, the connectors serving to join the plug-in modules 5. The wiring of the plug-in modules in respect to one another and to the other housing parts can be by means of cables in the conventional way or by means of printed contact boards or the like. For wiring the components contained in the covers 2 and 3 and for input wiring and the like, additional plug boards or cables 23 are housed below the plates 4 or may be formed integrally within the plates. The cables have multi-point connectors 25 on both the front and back sides which can be aligned that such automatic joinder of the plugs 25 with corresponding plugs on the front and back covers occurs upon securing of the covers in the closed position. As indicated at 22, the front cover 3 may additionally be provided with various operating components, for example potentiometers, which are affixed to the cover wall in a moisture proof manner.

Figure 3:
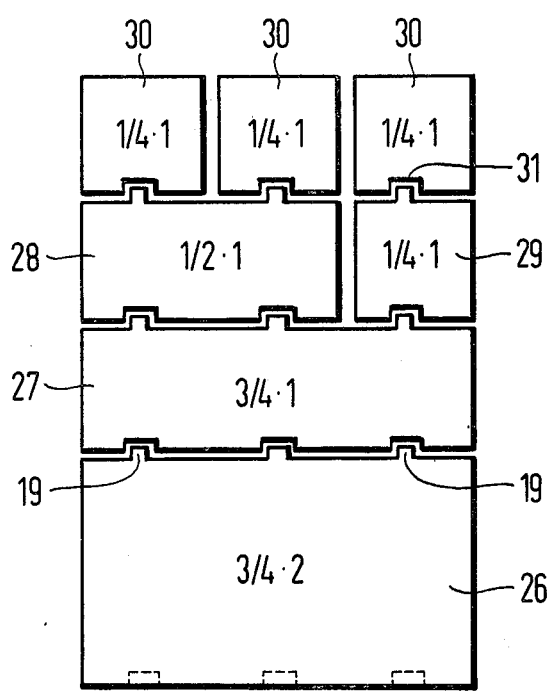
FIG. 3 is a diagrammatic presentation of a stack of housings according to this invention.

FIG. 3 diagrammatically illustrates stacking of individual housings such as that illustrated in FIG. 1. The top surface of the housing, as illustrated in FIG. 1, is not only equipped with strengthening ribs, but is also provided with projecting cams 19 which can index with corresponding strengthening ribs on the underside of a stacked housing. Additionally, the U-shaped guide rail, as shown in FIG. 1 is provided on the top of the housing with the bight section of the U running across the front of the housing and legs projecting back along the sides of the housing. An equivalent guide rail is preferably attached to the lower side of the housing. The guide rails are used to attach the housing to a main support frame in a vibration accommodating manner.

The stacking arrangement illustrated in FIG. 3 allows the use of housings of various widths and heights. For example, the lowest housing 26 has the width of three of the housings 30 and is double the height of the normal housing 27. The housing 28 has a double width as compared with housings 29 and 30 and about half the height of the housing 26. A full width single height housing, as shown in FIG. 1 will be equipped with 3 rows of cams 19 in the horizontal direction. The cams in each row grasp corresponding strengthening ribs 31 on the underside of the housing stacked there atop thereby allowing individual housings to be placed one on top of each other without any additional connection in a substantially immovable manner, inasmuch as in the preferred embodiment, the height of projection of the cams 19 corresponds to the depth of the recesses between the ribs 31.

Figure 4:
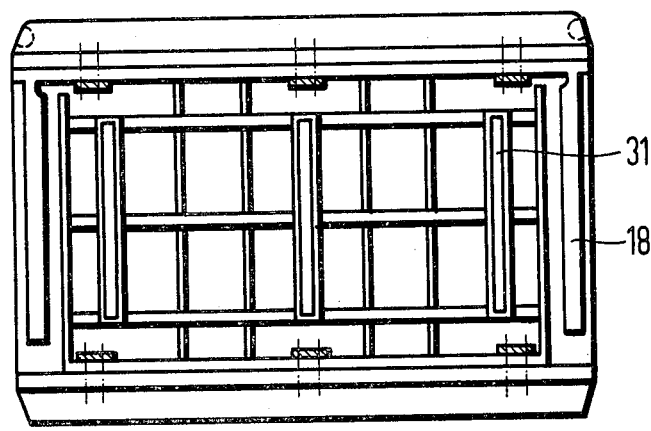
FIG. 4 is a bottom plan view of the housing of this invention.

The ribs 31 are clearly shown in the bottom plan view of FIG. 4.

Figure 5:
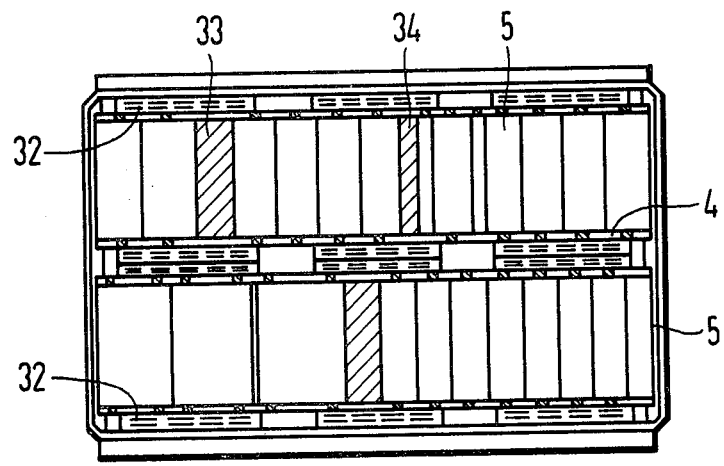
FIG. 5 is a front elevational view of an open double height housing.

FIG. 5 is a front elevational view of a housing with the front door removed and illustrates placement and stacking of the components. The view is of a double height housing and has two sets of component receiving plates 4 located one on top of the other whereby two rows of plug-in modules 5 can be provided. Corresponding plug junction units 32 can be provided both above and below the plates 4. Additionally, in order to increase heat dissipation in the desired localized areas, cooling blocks 33 and 34 of various widths can be inserted between the rib plates 4.

Figure 6:
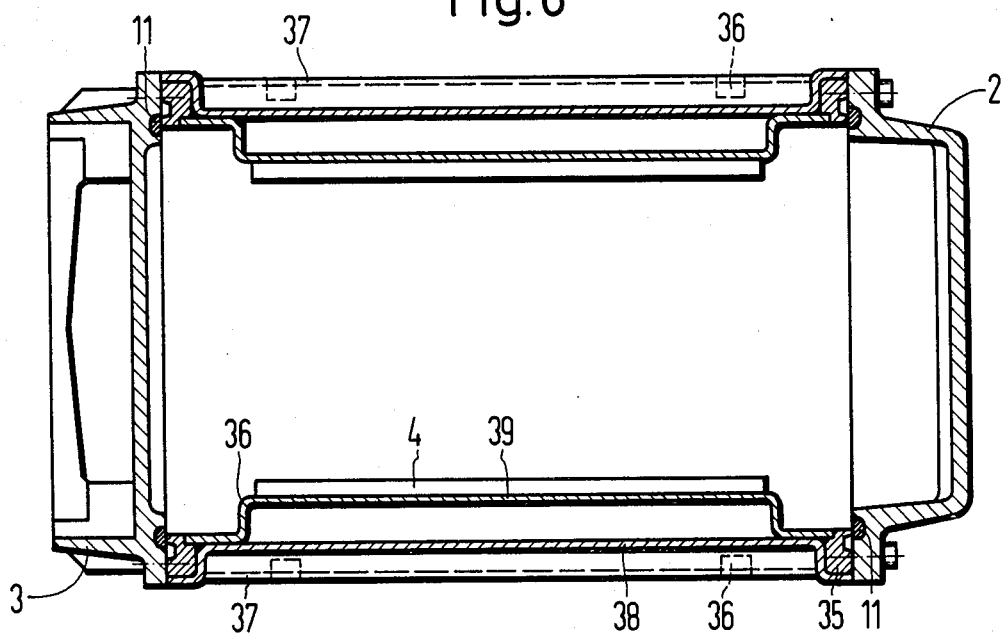
FIG. 6 is a cross sectional view of a housing according to this invention constructed of sheet metal.

Although the main housing frame can be advantageously constructed of cast metal, in a preferred embodiment, it can also be constructed of sheet metal. FIG. 6 illustrates a cross sectional view of a sheet metal housing. For this purpose, two metal sheets 38 and 39 are provided having a U-shaped profile in longitudinal cross section. The plates are joined together at the edges or longitudinal end areas, by means such as welding. At the same time they are attached to strips 35 which form the mounting flange and seal rib 13. In this construction cross bars 37 are additionally provided at the top and bottom side edges to function in the manner of the guide rails 18 of the die cast frame member illustrated in FIG. 1. The cross bars 37 are provided with threaded screw sockets 36 for mounting the housing to the main support frame as is discussed hereinafter.

Figure 7B:
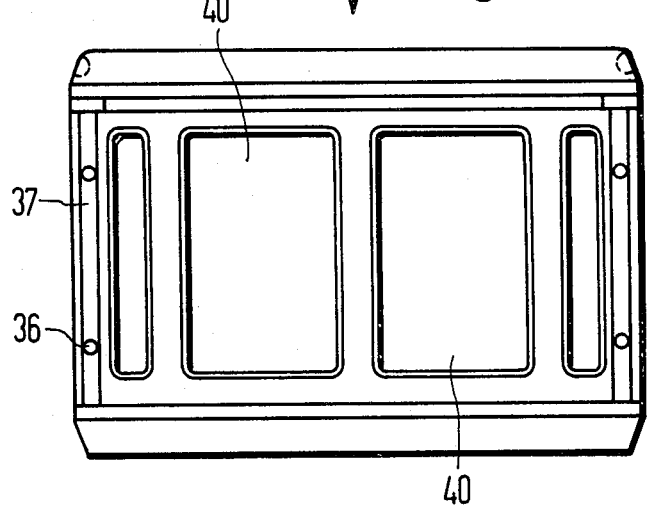
FIG. 7B is a bottom plan view of the housing of FIG. 6.
Figure 7C:
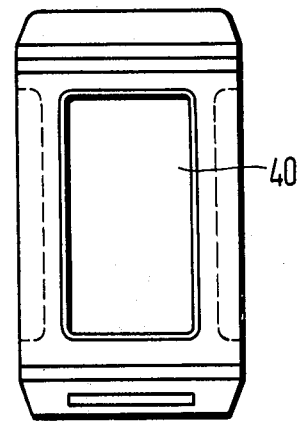
FIG. 7C is a side elevational view of the housing of FIG. 7B.
Figure 7A:
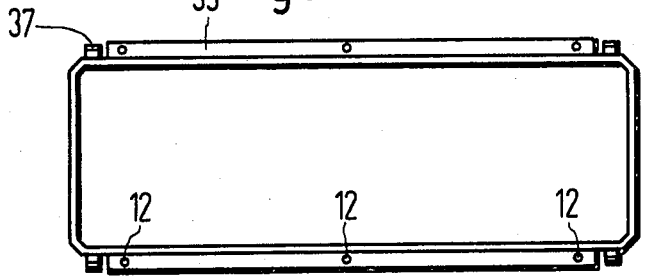
FIG. 7A is a front elevational view of the open housing of FIG. 6 taken in the direction indicated by the arrow A of FIG. 7B.
Figure 7D:
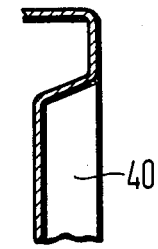
FIG. 7D is a fragmentary cross sectional view of a sheet metal part of the housing of FIG. 6.

FIGS. 7A through D show various side views illustrating features of the sheet metal housing of FIG. 6. FIG. 7B is a bottom plan view of the housing of FIG. 6 and FIG. 7C is a side plan view. FIG. 7A is an open front view of the housing taken generally in the direction illustrated by the arrow A of FIG. 7B.

The U-shaped depression or profile described in connection with FIG. 6 is illustrated at 40 in FIG. 7B and C showing that more than one depression per side can be provided. The supporting cross bars 37 are shown in place in FIG. 7B and 7A and the mounting frame members 35 interposed between the two metal sheets at the open ends are illustrated best in FIG. 7A. FIG. 7D illustrates, again in cross section, a fragmentary portion of a metal sheet used to construct the housing, the cross section being taken other than shown in FIG. 6.

Figure 8:
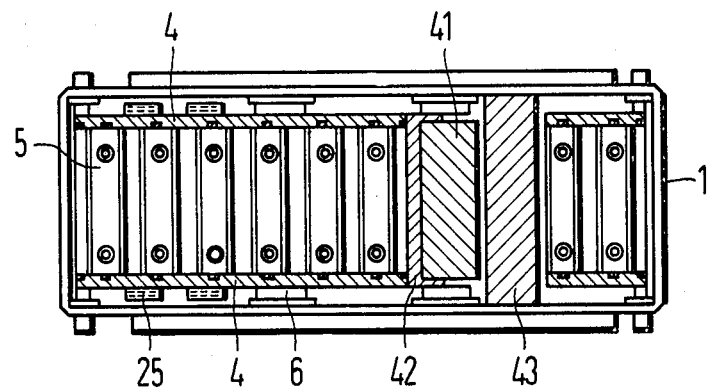
FIG. 8 is an open front elevational view of a housing according to this invention with components received therein.

FIG. 8 is an open end view similar to FIG. 5 illustrating a single height housing and disclosing additional possible internal component arrangements. In addition to plug-in modules 5 received in ribbed plates 4, structural modules 43 are bolted directly to the main housing frame 1 in order to improve heat discharge. Again, in order to provide heat discharge, modules capable of producing high heat such as 41 can be received in metal cooling plates 42 which can either be in direct contact with the walls of the main housing frame or can be in contact through conducting spacing blocks 6. The blocks 6 are preferably constructed in the form of cast ribs on the cast housing itself, or, in the case of the sheet metal housing, in the form of guide rails welded onto the sheet metal housing.

Figure 9:
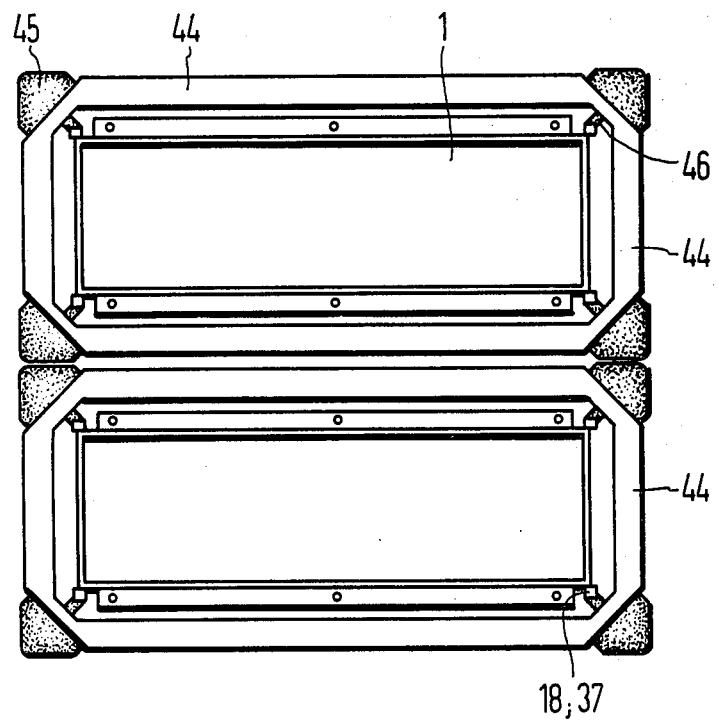
FIG. 9 is a diagrammatic view of two housings received in supporting frames.

As shown in FIG. 9 the individual housing frames 1 are received in main support frames 44 in a vibration accommodating manner. The main support frames 44, which are themselves anti-vibration frames, are known and have dampening elements 45 at their corners which, once again, form seats and cams for superimposing several main support frames one on top of the other if desired. Rubber or other anti-vibration connector members 46, which are preferably arranged at the corners of the housings are positioned so that they exhibit a diagonal spring suspension for the purpose of mounting the housings 1 within the main support frames 44. It is to be understood that it is possible to arrange several connector members 46 on guide rails 18 shown in FIG. 1 or rails 37 as shown in FIGS. 6 and 7 in order to provide support and stabilization.

Figure 10:
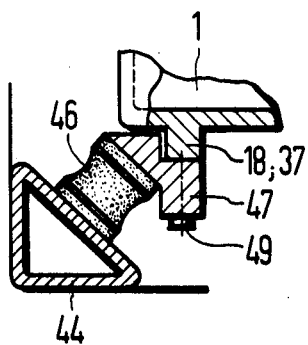
FIGS. 10, 11, and 12 are fragmentary cross sectional views of housing to supporting frame connections.
Figure 11:
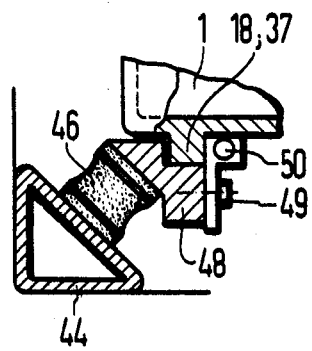
Figure 12:
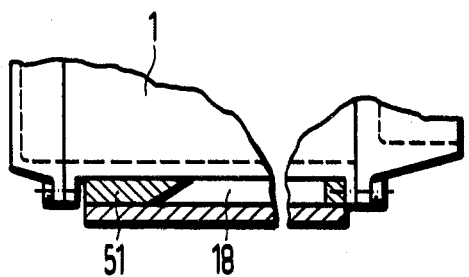

FIGS. 10 through 12 illustrate a number of mounting possibilities for connecting the housing frame 1 to the main support frame 44. FIG. 10 illustrates a construction wherein the connector member 46 is attached to the corner member of the main support frame 44, the other end of the connector member being attached to a rail member 47 which acts as a track guide rail for attachment to the housing. Screws 49 are provided for the purpose of attaching the guide rail 47 to the housing rails 18 or 37. In this construction, the rails 47 act as slide rails. FIG. 11 shows a modification of the device of FIG. 10 wherein the guide rail 48 carries a fixing member which is attached by screws 49. As indicated at 50, additional screws can be provided for attachment to the housing main frame 1.

As shown in FIG. 12, the mounting assembly illustrated in FIGS. 10 and 11 can also be used as a slide abuttment lock to further firmly affix the housing frame 1 to the main support frames 44. In this construction, the mounting rail 18 of the housing frame has a wedge shaped rear end profile, as shown in FIG. 1. The guide rail 47 or 48 of FIGS. 10 or 11 is also formed with a corresponding inverted wedge shaped end 51 which will index and lock with the wedge shaped end of the mounting rail 18. In this type of construction, when the housing is slid into place on the guide rail 47 or 48, it will then be locked in place immediately. Of course this can be used with the screws 49 and 50 to provide a firm attachment.

Figure 13:
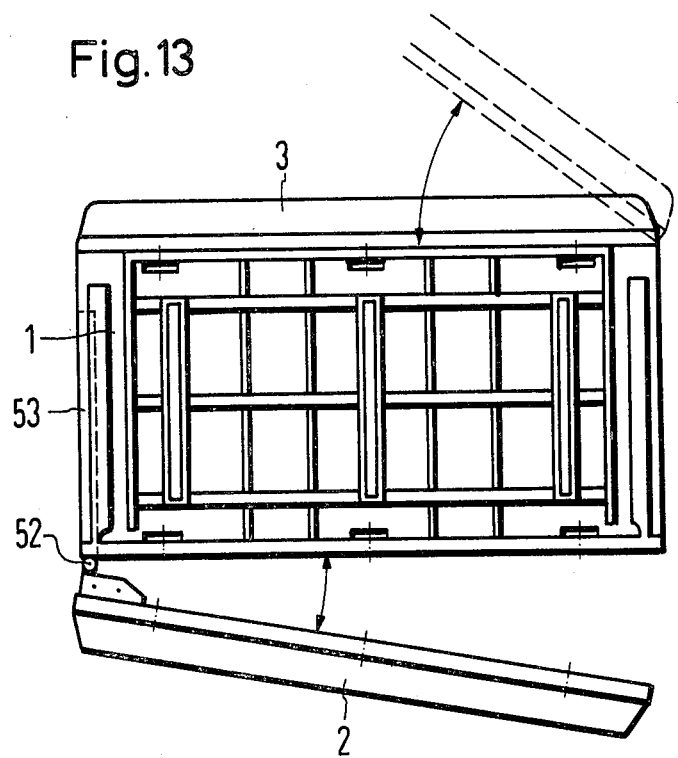
FIG. 13 is a top plan diagrammatic view of the housing according to this invention illustrating the support of the front and rear covers.
Figure 14:
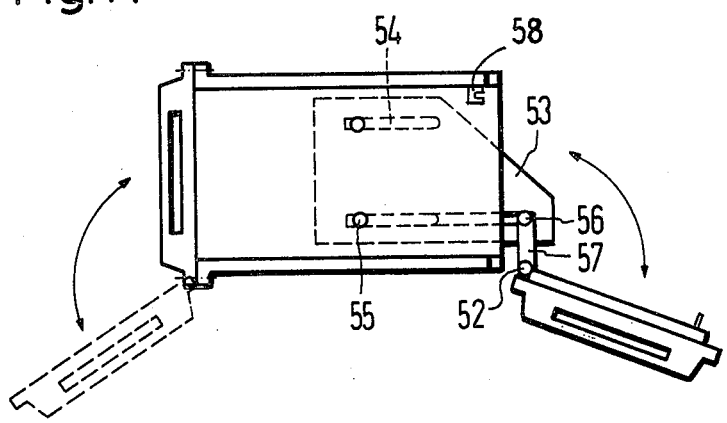
FIG. 14 is a side diagrammatic view of a housing according to this invention illustrating an alternate method of hinging the front and rear covers.

FIGS. 13 and 14 illustrate additional improvements in connection with the attachment of the front 2 and rear covers 3. As these figures illustrate, the covers can be attached by means of hinges 52. In such a case, latch type locks 58 would be provided on the side of the cover opposite the hinge.

In order that the cover can be opened when the housing is installed in the main support frame, it is preferable if the hinge 52 of the front cover not be directly attached to the housing frame 1. For this purpose additional metal sheets 53 which are removable, to an extent, from the interior of the housing are attached interiorly of the housing and carry the hinges 52.

As best illustrated in FIG. 14, in order to assure that the cover can be opened when received in the main support frame, the plate 53 is equipped with grooves 54 which index with bolts 55 attached to the interior of the housing side wall. This allows the plate 53 to be partially removed from the housing prior to swinging the cover open. In the embodiment of FIG. 13, both covers are hinged in such a way that they open horizontally. In FIG. 14, both covers are hinged such that they open vertically. In order to provide an improved opening capability, the hinge 52 can be connected to the plate 53 through links 57 providing an additional hinge point 56 at the point of attachment to the plate 53.

Although the teachings of our invention have herein been discussed with reference to specific theories and embodiments, it is to be understood that these are by way of illustration only and that others may wish to utilize our invention in different designs or applications.

We claim as our invention:

1. A housing for receiving a plurality of components used in electrical communications and measurement fields comprising: in combination, a six-sided housing member with open opposed front and rear sides closed by front and rear covers, the housing member mounted in a support frame by means of vibration accommodating mountings, the housing having at least one plug-in module receiving carrier assembly received therein adapted to receive modules from both the front and rear, said covers tightly closing said open sides, electrical insulating and moisture seal means between collars on inner-surfaces of said covers and the remainder of said housing, said covers recessed on housing inner faces thereof, the recesses providing heat dissipating fixture areas for attachment of high heat producing components, said front cover having operating elements and connection contacts on an exterior surface thereof protected by a protruding collar extending outwardly at peripheral areas of the exterior surface.

2. A housing according to claim 1 wherein said at least one carrier assembly occupies only a portion of the interior space of the housing, remaining portions of said space having means for direct connection of high heat producing components to interior walls of the housing.

3. A housing according to claim 1 wherein the housing, except for said covers, is constructed of inner and outer walls of sheet metal joined at their front and rear peripheries, said housing having external top and bottom projecting ribs spaced from one another and aligned with one another to provide interlocking stability of adjacent housings stacked one above the other, said ribs accommodating stacking of housings of different widths.

4. A housing according to claim 3 wherein the housing is constructed of cast metal and has top and bottom projecting ribs spaced from one another to provide interlocking stability of adjacent housings stacked one above the other, said ribs accommodating stacking of housings of different widths.

5. A housing according to claim 1 wherein said covers are attached to the remainder of said housing through hinge means and are securable thereto by latch means with the rear cover hinged directly to the said remainder and the front cover hingably connected to an intermediate extensible member attached to the housing interiorly thereof.

6. A housing according to claim 5 wherein the hinged covers open horizontally of said housing.

7. A housing of claim 5 wherein the hinged covers open vertically of said housing.

* * * * *